United States Patent [19]

Olsen

[11] 4,425,540

[45] Jan. 10, 1984

[54] APPARATUS AND METHOD FOR PYROELECTRIC POWER CONVERSION

[75] Inventor: Randall B. Olsen, Olivenhain, Calif.

[73] Assignee: Power Conversion Technology, Inc., San Diego, Calif.

[21] Appl. No.: 270,105

[22] Filed: Jun. 3, 1981

[51] Int. Cl.³ .............................................. H02N 1/00
[52] U.S. Cl. .................................. 322/2 A; 310/306; 310/308
[58] Field of Search ............... 322/2 A, 2 R; 310/306, 310/308

[56] References Cited

U.S. PATENT DOCUMENTS

| | | | |
|---|---|---|---|
| 2,635,431 | 4/1953 | Bichowsky | 310/306 X |
| 3,243,687 | 3/1966 | Hoh | 322/2 R |
| 4,220,906 | 9/1980 | Drummond | 322/2 A |

*Primary Examiner*—R. J. Hickey
*Attorney, Agent, or Firm*—Bruno J. Verbeck; Joseph C. Schwalbach

[57] ABSTRACT

Apparatus and method for converting heat to electrical energy by the use of one or more capacitors having temperature dependent capacitance. The capacitor is cycled between relatively high and relatively low temperatures by successive thermal contact with relatively high and relatively low temperature portions of a heat transfer medium having a temperature gradient therein. Upon heating of the capacitor, the capacitance thereof is reduced, so that a charge therein is caused to expand into associated external circuitry in which it is available to do electrical work. The capacitor is then cooled and recharged and the cycle is repeated. The electrical output of the capacitor results from the regenerative delivery of heat to and removal of heat from the capacitor by the heat transfer medium, and efficient conversion of heat to electric energy is thereby effected.

44 Claims, 12 Drawing Figures

APPARATUS AND METHOD FOR PYROELECTRIC POWER CONVERSION

The U.S. government has rights in this invention pursuant to Contract No. DE-ACO3-ER7801736 awarded by the U.S. Department of Energy.

BACKGROUND OF THE INVENTION

This invention relates to improvements in pyroelectric power conversion and more particularly to the conversion of heat to electrical energy by the use of one or more capacitors having temperature dependent capacitance and novel regenerative means for thermally cycling such capacitors, there being means for charging the capacitor during the cool portion of its thermal cycle so that upon subsequent heating and concomitant decrease in the dielectric constant of the capacitor, the charge therein is caused to expand into associated circuitry in which it is available to do electrical work.

DESCRIPTION OF THE PRIOR ART

The use of thermally cycled capacitors in energy conversion is attractive because the working substance is a solid, rather than a gas or vapor, and because of its very high density it requires little volume to handle large power flows. Moreover, with operation at relatively low working temperatures, e.g., 350° C., and at pressures approximating atmospheric, the cost factors are significantly lower than for other forms of power conversion apparatus. While the concept of deriving electrical energy by thermally cycling temperature dependent capacitors has been known, the small efficiencies that heretofore have been experienced, have apparently precluded their use in any practical application for the production of electrical energy.

Representative of the prior art is Drummond U.S. Pat. No. 4,220,906 This patent discloses the conversion of heat to electrical energy by the use of stacked capacitors having temperature dependent capacitance and the use of reeds which serve as thermal switches and are caused to vibrate by the flow of vapor carrying heat between stages, thereby pulsing the heat at the proper frequency and phase through the stacked capacitors. Skinner U.S. Pat. No. 3,610,970 exploits a somewhat different concept in an energy conversion system in which a first material within the region between the electrodes of a capacitor is replaced, following charging of the capacitor, by second material having a lower dielectric constant than the first material. The capacitor is then discharged and the first material restored to the region between the capacitor electrodes for subsequent recharging. Brown U.S. Pat. No. 4,069,028 covers a method for magnetic heat pumping employing a ferromagnetic or ferrimagnetic element and a regenerator, and in which the magnetic field strength applied to, and the temperature of, the element are both successively changed between five different levels.

SUMMARY OF THE INVENTION

The present invention provides apparatus and a method for converting heat to electrical energy by the use of one or more capacitors having temperature dependent capacitance. The capacitor is cycled between relatively high and relatively low temperatures by successive thermal contact with relatively high and relatively low temperature portions of a heat transfer medium having a temperature gradient therein. Upon heating of a charged capacitor the capacitance thereof is reduced, so that the charge therein is caused to expand into associated external circuitry in which it is available to do electrical work. The capacitor is then cooled and recharged, and the cycle repeated.

Efficient conversion of heat to electrical energy is effected in the apparatus by virtue of the fact that the electrical output of the capacitor results from the regenerative delivery of heat to and removal of heat from the capacitor by the heat transfer medium.

DETAILED DESCRIPTION OF THE INVENTION

Broadly stated, the present invention is directed to apparatus and a method for converting heat to electrical energy by using heat energy to move an electrical charge without passing the energy through an intermediate mechanical form. The present invention utilizes one or more capacitors in which the dielectric material has temperature dependent capacitance. This causes charge to be alternately expelled from and attracted to it, doing electrical work as the capacitor is thermally cycled. Particularly useful as such dielectric material are ferroelectric materials comprising lead zirconate, lead titanate, and lead stannate, such materials being hereinafter referred to as PZST materials.

Prior to discussing the detailed operation and structure of the apparatus and method of the present invention, it should be understood that, while a single capacitor having temperature dependent capacitance can be driven through a thermal cycle to produce a given amount of electricity, the usefulness of the invention from a practical standpoint resides in producing significant quantities of electrical energy that result from effectively staging or combining of a large number of such capacitors. Effective staging requires selection for a given capacitor of dielectric material whose transition point is matched to the temperature range within which such capacitor is cycled during operation of the apparatus.

Figure 1:
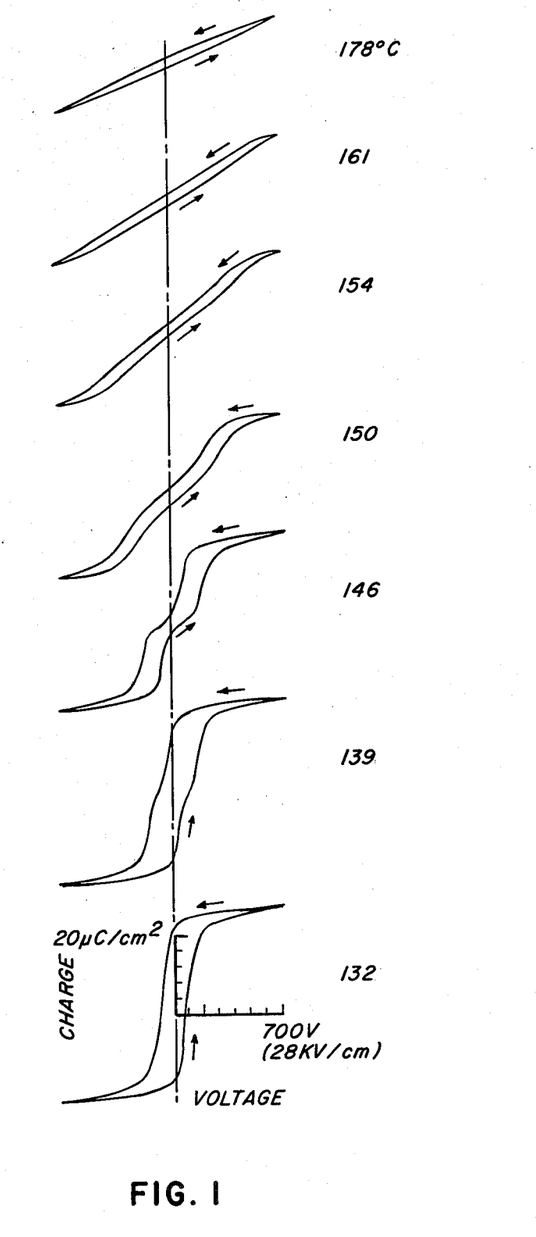
FIG. 1 is a graphic illustration showing a family of hysteresis curves illustrating the isothermal charge-voltage behavior of a ferroelectric material at various temperatures.

The electrical energy production cycle of a capacitor in the apparatus of the present invention may be described in terms of the charge-voltage (hysteresis) behavior of a capacitor incorporating ferroelectric dielectric material, such as a PZST material. Referring to FIG. 1 of the drawings, the hysteresis loops therein illustrate the isothermal charge-voltage behavior at various temperatures for capacitors utilizing the ferroelectric material $Pb_{0.99} Nb_{0.02} (Zr_{0.68}, Sn_{0.25}, Ti_{0.07})_{0.98} O_3$. For any cyclic process, an area on a charge-voltage diagram represents electrical work, since $W = \int V dq$, where W represents electrical work, V represents voltage, and q represents charge. For example, every time that voltage is applied to a capacitor utilizing ferroelectric material and maintained at a given temperature, an amount of electrical energy equal to the hysteresis loop area is dissipated as heat. In this case the loop is cycled in a counter-clockwise sense, as indicated by the arrows in FIG. 1.

The present invention exploits the concept that, by removing the isothermal constraint, it is possible to reverse the direction in which the loop is cycled, i.e., to cause it to be cycled clockwise. This results in the production of electrical energy from heat. The family of hysteresis loops in FIG. 1 dramatically illustrates the remarkable temperature dependence of the charge-voltage loop of a capacitor comprising ferroelectric dielectric material. Because of this temperature dependence, it is possible, by controlling temperature as well as applied voltage, to constrain a ferroelectric capacitor to execute an electrical energy-producing clockwise loop.

Figure 2:
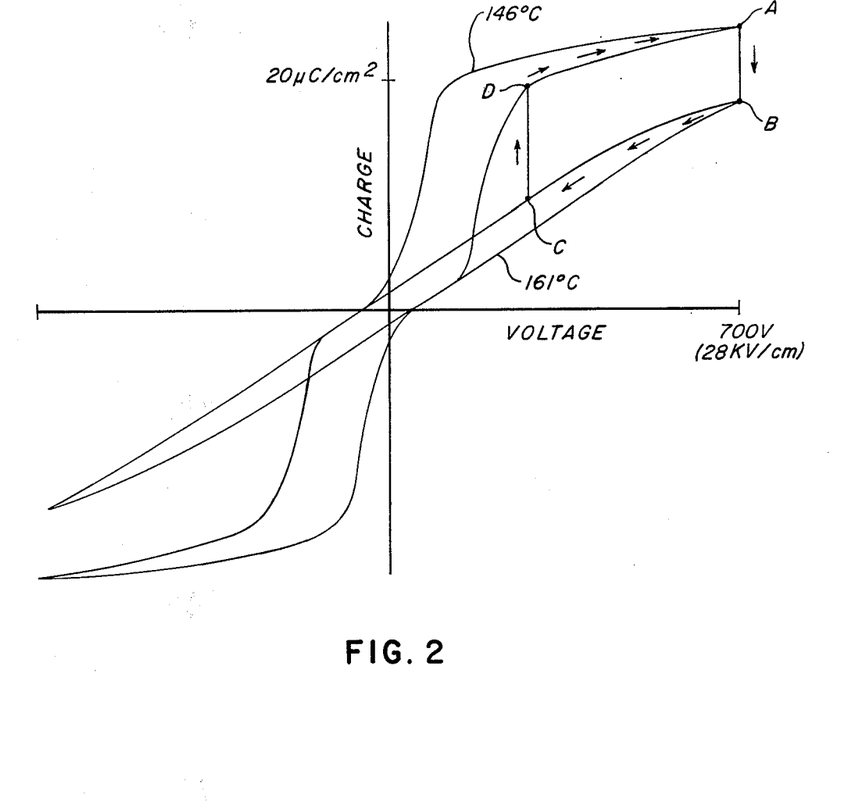
FIG. 2 shows on a larger scale two of the hysteresis curves of FIG. 1 superimposed upon one another and graphically illustrates the operation of the invention.

FIG. 2 shows the charge-voltage characteristics, i.e., the hysteresis loops characteristics of the aforementioned PZST material at 146° C. and at 161° C. The production of electrical energy by thermally cycling a PZST capacitor around a clockwise loop between these two temperatures will now be described.

Starting at point A with the capacitor at the lower temperature (146° C.) and substantially fully charged at high voltage, for example 700 volts and an electric field of the order of 28 kv/cm, heating of the capacitor to the higher temperature (161° C.) at point B causes it to be partially discharged, for example into associated electrical circuitry including a high voltage source. After reaching the higher temperature, a switch to a low voltage source, for example 120 volts, permits the capacitor to substantially fully discharge into that source by the time point C is reached, the capacitor voltage having by this time dropped to a low value. At point C the capacitor is allowed to cool from the higher to the lower temperature, during which time it is partially recharged from the low voltage source by the time it reaches point D. A switch back to the high voltage source at point D increases the voltage supplied to the capacitor and fully recharges the latter to its original voltage and charge at the low temperature as point A is reached. This completes a clockwise cycle which is opposite to the counter-clockwise isothermal hysteretic loop direction, and the amount of electrical energy produced by one thermal cycle of the capacitor is represented by the area ABCD of FIG. 2.

Since the conversion efficiency of the apparatus is the ratio of electrical energy produced to the heat input at the higher temperature, any reduction in the heat input for a given energy output goes to increase the conversion efficiency. In the present invention the heat input is reduced by the use of a second thermodynamic medium or regenerator. While the specific structure of the apparatus of the present invention will be described in detail hereinafter, the means by which the capacitor is cycled between the higher and lower temperatures aforementioned by the use of the regenerator may be readily understood by reference to FIGS. 3 to 8.

Figures 3, 4, 5, 8:
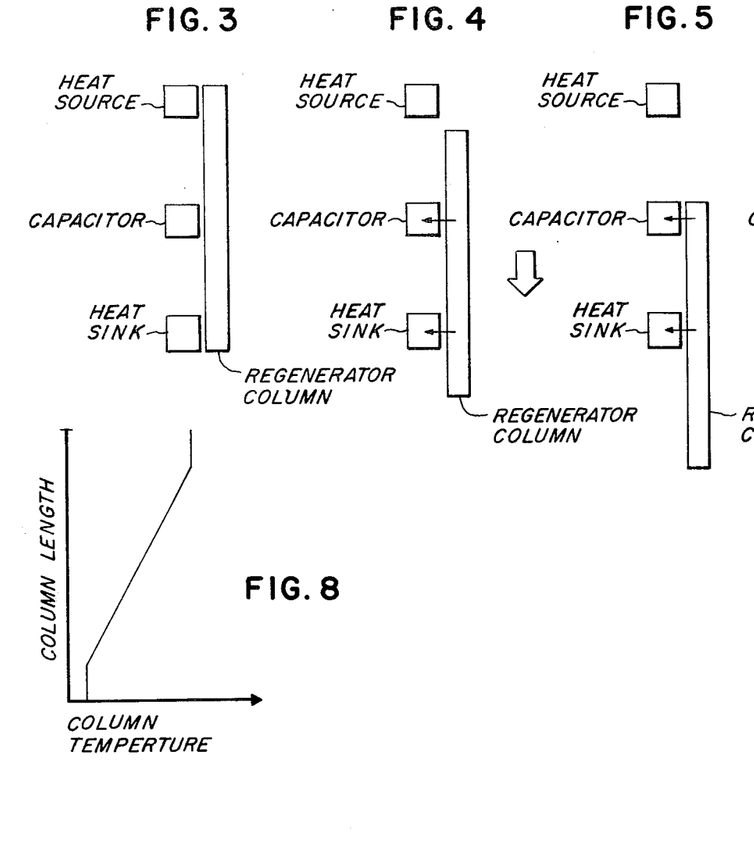
FIGS. 3 through 7 illustrate heat flows during different stages of the operational cycle of the apparatus.
FIG. 8 is a graphic illustration of the temperature gradient along the heat transfer medium regenerator column of the apparatus.

FIGS. 3 to 7 diagrammatically illustrate a fixedly positioned heat source, a fixedly positioned heat sink spaced therefrom, and a capacitor fixedly positioned therebetween. A movable regenerator column is disposed in heat transfer relation, i.e. thermal contact, with each of the source, sink, and capacitor in FIG. 3. It is understood that the regenerator column comprises a heat transfer medium which can be a solid, but in the presently preferred form of the invention it is a fluid, and more particularly a column of liquid. In operation, the regenerator column is cycled between its uppermost position shown in FIGS. 3 and 7 and its lowermost position shown in FIG. 5. FIG. 8 illustrates the temperature gradient within the regenerator column which varies substantially linearly along its length from the temperature of the heat sink at its lower end to the temperature of the heat source at its upper end. In FIG. 3 the capacitor is at the lower of the two temperatures between which it is cycled when the regenerator column is cycled as aforementioned, such capacitor temperature being an intermediate temperature along the temperature gradient of the regenerator column.

FIG. 4 illustrates the heat flow as the regenerator column is lowered to an intermediate position. Such movement brings portions of the regenerator column which are hotter than the capacitor into heat transfer relation therewith, so that heat flows from the column into the capacitor as indicated by the upper arrow. Coincident with this heat flow is another similar flow of heat from the regenerator column into the heat sink as shown by the lower arrow. Heat flow into both the capacitor and the heat sink continues as the regenerator column is moved to the lowest point in its stroke shown in FIG. 5. Upon the regenerator column reaching the lower end of its stroke shown in FIG. 5, the temperature of the capacitor has been raised to the upper of the two temperatures between which it is cycled by movement of the regenerator column.

Figure 6:
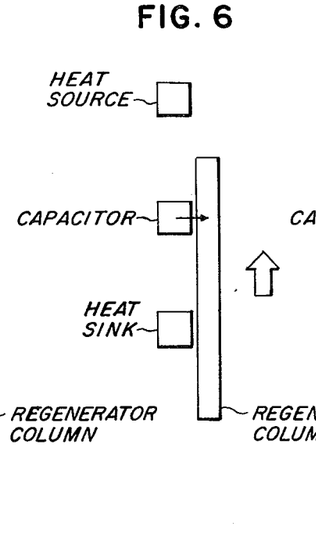
Figure 7:
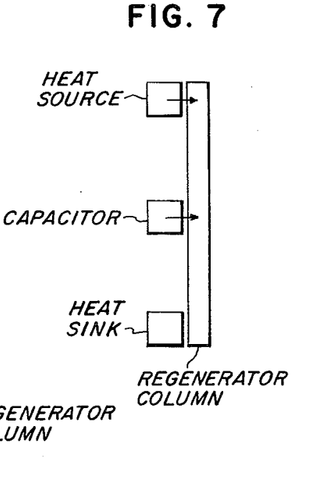

As a regenerator column is then moved upwardly as shown in FIG. 6, cooler portions of the regenerator column are brought into heat transfer relation with the capacitor and thus receive heat from the latter as shown by the arrow in FIG. 6. As upward movement of the regenerator column continues, the upper portion thereof moves into heat transfer relation with the heat source. Since the regenerator column is now cooler than the heat source because of the heat delivered to the capacitor by the column during the latter's downward stroke, heat flows from the source, as well as from the capacitor, to the regenerator column, as shown by the arrows in FIG. 7, ultimately returning the temperature profile of the regenerator column to that shown in FIG. 8 to complete on thermal cycle.

The fundamental concept of regeneration illustrated in FIGS. 3 to 7 is the nearly reversible heat exchange between the capacitor and the regenerator column. It will be observed that the heat received by the capacitor from the regenerator column during the downward stroke of the latter, is returned to the regenerator column during the upwardly stroke thereof. This partial recycling of heat substantially reduces the amount of heat needed from the heat source to effect heating of the capacitor and discharge of electrical energy from the capacitor into associated circuitry.

Figure 9:
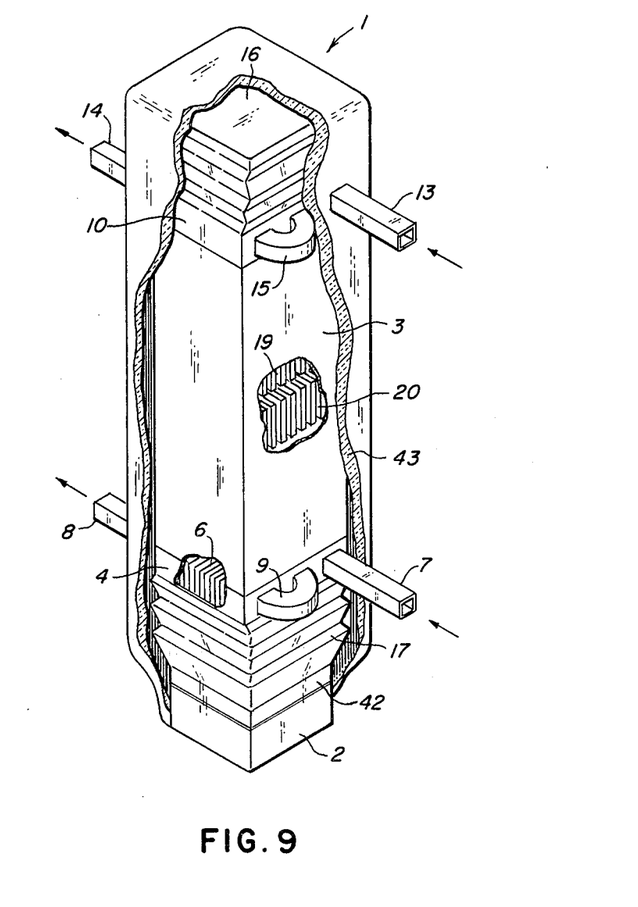
FIG. 9 is a perspective view of the preferred form of the apparatus of the present invention, parts being broken away to show interior structure.
Figures 10, 11:
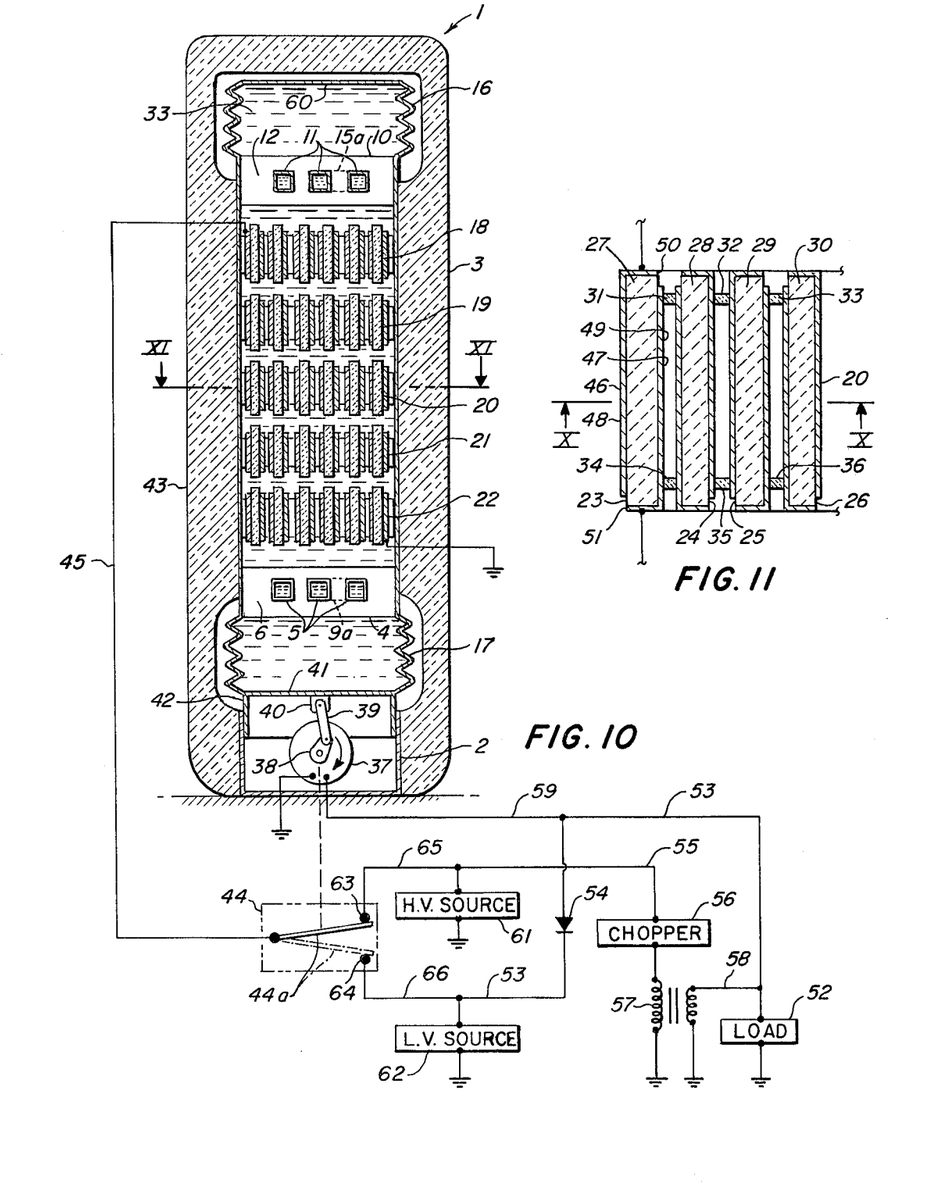
FIG. 10 is a vertical sectional view of the apparatus of FIG. 9 taken along the line X—X of FIG. 11 and including a schematic showing of the electrical circuitry of the apparatus.
FIG. 11 is an enlarged fragmentary horizontal sectional view of a capacitor stack as viewed along the line XI—XI of FIG. 10.

FIGS. 9 and 10 show a unitary pyroelectric conversion apparatus or module 1 constructed in accordance with the present invention. The illustrated apparatus has a rectangular base member 2, and spaced above and in vertical alignment with the base 2 is an elongated tubular rectangular body member 3. Mounted at the lower end of the body member 3 is a heat exchanger 4 which, in the illustrated embodiment, comprises three parallel metal ducts 5 which extend through and in heat transfer relation with a multiplicity of spaced vertical rectangular metal fins 6. As shown in FIG. 9, one of the outer ducts 5 is connected to a cooling fluid inlet duct 7 which is connected to a suitable source of cooling fluid (not shown). The other outer duct 5 is connected at one end with a cooling fluid outlet duct 8. The inner duct 5 is connected at one end to the adjacent end of the outer duct 5 to which the outlet duct 8 is connected by means of a U-shaped duct 9. The opposite end of the inner duct 5 is connected to the adjacent end of the outer duct to which the inlet duct 7 is connected by means of an arcuate duct 9a shown in broken lines in FIG. 10. From the foregoing it is apparent that the flow of cooling fluid through the heat exchanger 4 is in the same direction through both of the outer ducts 5, and is in the reverse direction through the inner duct 5.

A heat exchanger 10, which is similar to the heat exchanger 4, is mounted at the upper end of the body 3. The heat exchanger 10 has spaced parallel ducts 11 corresponding to the ducts 5, fins 12 corresponding to the fins 6, a hot fluid inlet duct 13 corresponding to the duct 7 and connected to a suitable source of hot fluid (not shown), and a heating fluid outlet duct 14, corresponding to the duct 8. The heat exchanger 10 also has an arcuate duct 15 corresponding to the duct 9, as well as an arcuate duct 15a corresponding to duct 9a. It is apparent that the flow of heating fluid through the ducts 11 of the heat exchanger 10 is similar to the flow of cooling fluid through the ducts 5 of heat exchanger 4. Mounted above the heat exchanger 10 is a rectangular bellows 16, and mounted below the heat exchanger 4 is a rectangular bellows 17 which preferably matches the bellows 16.

Mounted within the body 3 in vertically spaced horizontal relation is a plurality of capacitor stacks 18, 19, 20, 21, and 22. FIG. 11 shows on an enlarged scale a portion of one such stack and illustrates the structure thereof. More particularly, the capacitor stack portion illustrated in FIG. 11 comprises capacitors 23, 24, 25, and 26 which comprise, respectively, dielectric material in the form of elongated horizontally spaced, vertical rectangular plates 27, 28, 29, and 30. The plates 27 to 30 are formed of material having temperature dependent capacitance, for example, the PZST material mentioned hereinbefore. Each capacitor is provided with a pair of similar metal contact electrodes. For the sake of brevity, only the electrodes 46 and 47 of capacitor 23 will be described, it being understood that each capacitor preferably has the same basic structure. The contact electrodes 46 and 47 preferably take the form of plate members which are L-shaped in vertical cross section as shown, and respectively have elongated major portions 48 and 49 which overlay major surfaces of the dielectric plate 27 and have minor portions 50 and 51 which overlay the opposite end surfaces of the dielectric plate 27.

The capacitors of each stack are in horizontally spaced parallel relation by virtue of insulating spacers interposed therebetween as shown at 31 to 36 in FIG. 11. The capacitor stack illustrated in FIG. 11 shows the capacitors thereof electrically connected in parallel circuit relation. If suitable and desired, the capacitors of any stack may be connected in series circuit relation or a combination of series and parallel, rather than as shown. Similarly, the stacks 18 to 22 are preferably connected in parallel circuit relation, but may, if suitable and desired, be connected in series circuit relation or a combination of series and parallel.

The spaces within the body 3, the heat exchangers 4 and 10, and the bellows 16 and 17 are filled with a heat transfer medium 33 which, in the preferred form of the invention, is an electrically nonconductive liquid such as, for example, Dow Corning 100CS silicone oil, available from Dow Corning Corporation, Midland, Mich. The heat transfer medium 33 occupies the spaces between the capacitors of each of the stacks, as well as the spaces between the fins and ducts of the heat exchangers 4 and 10, and is in good heat exchange relation therewith. As an alternative, the heat transfer medium may take the form of a liquid metal, such as NaK. However, the use of liquid metal requires that appropriate insulation measures obvious to one skilled in the art be employed for prevention of electrical conduction tending to cause unwanted short circuiting.

Mounted within the base member 2 is an electric motor 37 on the shaft of which is mounted a crank arm 38 which, in turn, is pivotally connected to a link 39. The link 39 is pivotally connected to a lug 40 extending downwardly from the bottom wall 41 of the bellows 17. Also extending downwardly from the bellows wall 41 is a rectangular guide sleeve 42 which has a sliding telescoping fit within the base member 2. As shown, the apparatus 3 is provided with a jacket 43 of heat insulating material. It will be apparent from the foregoing that upon rotation of the shaft of motor 37 in the direction indicated, the action of the crank arm 38 and link 39 is effective to move the bellows wall 41 downwardly and thence upwardly, and that at the same time, the column of liquid 33 within body 3, as well as the wall 60 of bellows 16, are cycled downwardly and thence upwardly therewith.

As shown schematically in FIG. 10, one terminal of the connected stacks of capacitors 18 to 22 is connected to the blade 44a of a single pole double throw snap action switch 44 through a conductor 45, and the other terminal thereof is grounded as shown. A high voltage source 61 of, for example, 700 volts and a low voltage source 62 of, for example, 120 volts are respectively connected to switch contacts 63 and 64 through conductors 65 and 66 and are also grounded as shown. The voltage sources 61 and 62 may take the form of linear capacitors, batteries, or other suitable voltage sources.

The switch 44 is suitably connected for actuation by the motor 37 as indicated diagrammatically by the broken line extending upwardly from the blade 44a thereof. The driving connection to the motor 37 is such that when the bellows wall 41 is at the upper end of its stroke, the switch blade 44a is in engagement with contact 63 as shown in FIG. 10. When the bellows wall 41 is at the lower end of its stroke, the blade 44a is in its alternate position in engagement with the contact 64, as shown in dot and dash lines in FIG. 10.

A diode half wave rectifier 54 is included in a conductor 53 which connects the low voltage source 47 to one terminal of a load 52, the other terminal of the load being grounded as shown. The high voltage source 61 is connected by a conductor 55 to one terminal of a chopper 56 which, for example, has a frequency of 60 Hz. The other terminal of the chopper is connected to one terminal of the primary winding of a transformer 57, the other terminal of said winding being grounded as shown. The secondary winding of transformer 57 is connected in parallel with load 52 by a conductor 58 connecting one terminal of said winding to the conductor 53, the other terminal of said winding being grounded as shown. The motor 37 is connected in parallel with the load 52 by a conductor 59 connecting one terminal of the motor to the conductor 53, the other terminal of the motor being grounded as shown. The transformer 57 may, for example, be of the step down type such that the secondary winding thereof supplies 60 Hz 120 volt alternating current to the load 52 when its primary winding is energized with 700 volts of alternating current or intermittent direct current.

The column of heat transfer medium 33 between the heat exchanger 10, i.e., the heat source, and the heat exchanger 4, i.e., the heat sink, has a generally linear temperature gradient therein as represented in FIG. 8. Since a given PZST ferroelectric material is useful for conversion over only a relatively small temperature range (about 20° C.), the efficiency of the apparatus 1 is enhanced by staging of the capacitor stacks 18 to 22. Thus the capacitors of any given stack each employ a PZST material whose Curie temperature is matched to lower of the two temperatures to which said capacitors are exposed during operation of the apparatus 1. Since the Curie temperature of a given PZST material depends upon the tin/titanium ratio therein, PZST materials of various Curie temperatures can be produced by changes in the tin/titanium ratio therein. Matching of PZST material Curie temperatures to the lower of those to which such materials are exposed, i.e., staging, provides a larger working temperature span which corresponds to increased Carnot efficiency.

The operation of apparatus 1 will now be described. With hot fluid, for example, at 250° C., supplied to the inlet duct 13 of the heat exchanger 10 and cold fluid, for example, at 50° C., supplied to the inlet duct 7 of the heat exchanger 4, the apparatus is allowed to develop a stable heat gradient in the column of heat transfer medium 33 between the exchangers 10 and 4, which gradient is represented in FIG. 8. Assuming that the high and low voltage sources 61 and 62 take the form of linear capacitors, the apparatus is started up by simultaneously charging the high voltage source 61 with a high voltage, for example 700 volts dc, and the low voltage source 62 with a low voltage, for example 120 volts dc. Such charging can be accomplished, for example, by the use of a battery powered inverter-transformer-rectifier (dc to dc) circuit well known in the art.

With the parts in the positions shown in FIG. 10, the capacitors in the connected stacks 18 to 22 are connected in parallel with the source 61 and the capacitors thereof are thereby given the same high voltage charge as the source 61 on start up. On start up, current also flows from the source 61 to the chopper 56 and thence through the primary winding of transformer 57. The 60 Hz intermittent energization of the primary winding of transformer 57 produced by the chopper 56 results in output at the secondary winding of the transformer in the form of 120 volt 60 Hz alternating current which is supplied to the load 52 through conductors 58 and 53 and to motor 37 through conductors 58, 53, and 59. The motor thereupon begins operation in the clockwise direction indicated by the arrow in FIG. 10.

In order to avoid complete depletion of the charge in the capacitor stacks 18 to 22 during subsequent discharge thereof as will be described, means is provided to divert to the low voltage source 62, and hence to said stacks, a portion of the electrical energy discharged into the external load circuit. More specifically, current is supplied to the low voltage source 62 from the load circuit via conductor 53 and rectifier 54 at approximately the same rate as it is extracted from the capacitor stacks 18 to 22. It will be observed that, though the currents are equal, the powers are not. The power returned to the low voltage source 62 is less than 18% of the extracted power.

With reference to FIG. 2, operation of the apparatus 1 will be described with respect to a stack of capacitors which employ the PZST material of which the hysteresis loops of FIGS. 1 and 2 are representative. For the purpose of simplicity of description it will be assumed that such stack is initially in thermal contact with a portion of the column of heat transfer medium 33 within the body 3 which is at a temperature of, for example, about 146° C. The parts are then positioned as shown in FIG. 10, i.e., the bellows wall 41 is substantially at the upper end of its stroke. This position is represented at point A on FIG. 2. As the motor 37 rotates and moves the bellows wall 41 downwardly, the column of heat transfer medium 33 within the body 3 is moved downwardly therewith to bring warmer portions of the heat transfer medium into thermal contact with the capacitors, raising the temperature of the latter. As the temperature of the capacitors is raised, the capacitance of the PZST dielectric material therein is reduced, causing the charge therein to flow out through conductor 45 to the source 61, as well as to and through the chopper 56 and the primary winding of transformer 57. When the transformer primary is thus energized, 120 volt, 60 Hz, current is supplied by the secondary winding to load 52 and motor 37.

When the bellows wall 41 reaches the lower end of its stroke, the capacitors are in thermal contact with a portion of the heat transfer medium which is at a temperature of about 161° C., i.e., point B on FIG. 2, and because of the increase in their temperature, the capacitors are partially discharged at that point. At the time of or slightly before bellows wall 41 reaches the lower end of its stroke, the switch blade 44a is actuated to its dot and dash line position in engagement with the switch contact 64, and the capacitor stacks are thereby connected in parallel with the low voltage source 62. Since the vertical movement of the bellows wall 41 at the extremes of its stroke is relatively small compared to the angular travel of the crank arm 38 at those points, the initial upward movement of said bellows wall and of the column of heat transfer medium thereabove is relatively slow. Thus, there is a time lag during which the capacitors remain substantially at the higher temperature. During this time lag, the capacitors are substantially discharged into the low voltage source 62 as point C in FIG. 2 is reached.

Upon upward movement of the bellows wall 41 and concomitant upward movement of the column of heat transfer medium 33, cooler portions of the medium are brought into thermal contact with the capacitors. As the capacitors are thus cooled, the capacitance thereof is increased, and they are accordingly partially recharged from the low voltage source 62. As the bellows wall 41 and the column of heat transfer medium 33 approach the upper end of their stroke, the capacitors are thereby cooled to about 146° C. as represented by point D in FIG. 2. At the time or slightly before the bellows wall 41 reaches the upper end of its stroke, the switch blade 44a is returned to engagement with the contact 63, to thereby switch the capacitor stack back into parallel circuit relation with the high voltage source 61. Since the capacitance of the capacitors is at its maximum for the thermal cycle at point D, the capacitors are substantially fully charged up to their original voltage during the time lag at the upper end of the stroke during which the temperature thereof remains relatively constant, as represented by the line DA in FIG. 2.

Thus, as shown in FIG. 2, an electrical cycle has been executed in a clockwise manner, and an amount of electrical energy represented by the area ABCD of FIG. 2 is produced. The actual energy output of the apparatus 1 will depend upon a number of factors, including the volume and number of the capacitors employed therein. However, measurements indicate that the apparatus is capable of producing 200 Joules per liter of PZST material per thermal cycle.

Figure 12:
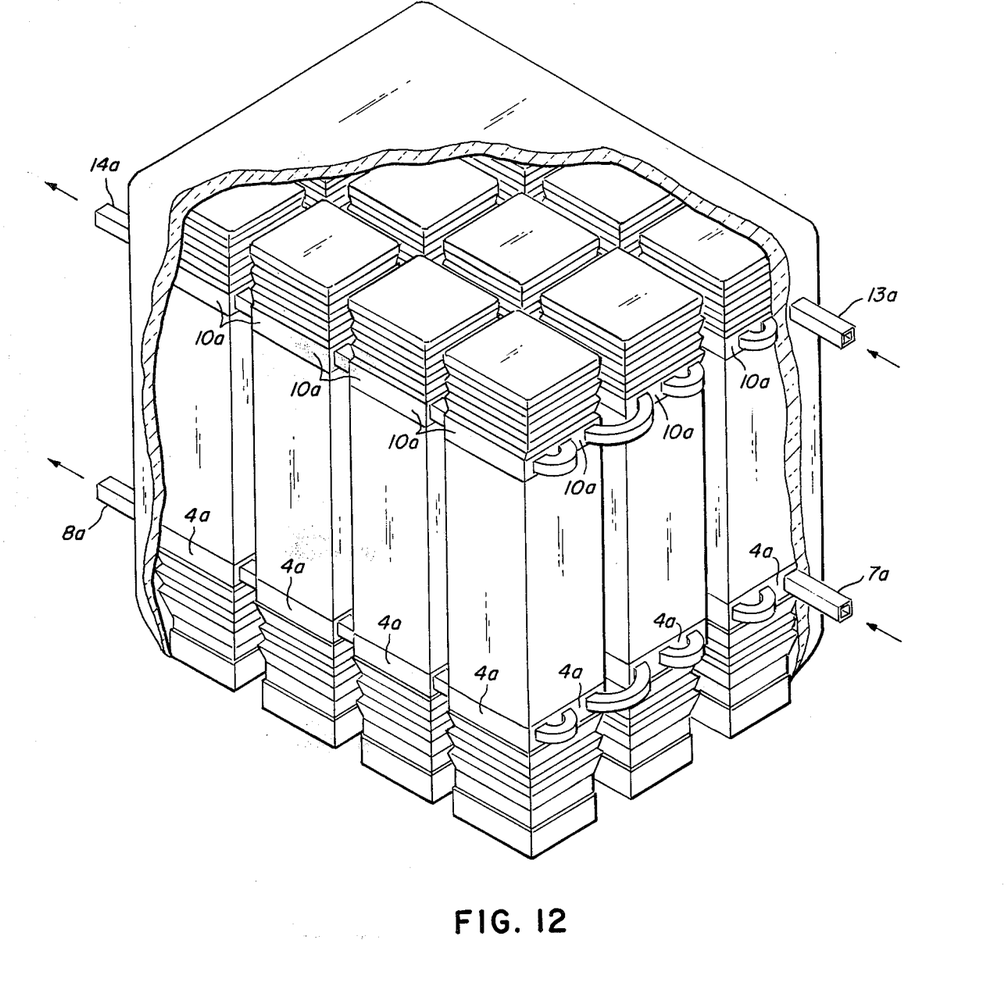
FIG. 12 is a perspective view of a modular power conversion apparatus comprising twelve modules of the apparatus shown in FIG. 10 having common heating and common cooling fluid ducting.

Various forms and adaptations of the apparatus 1 shown in FIGS. 9 and 10 are possible. FIG. 12 shows a composite of 12 modular units of the type of the apparatus 1 of FIGS. 9 and 10. In FIG. 12 the upper heat exchangers 10a corresponding to the exchangers 10 in FIGS. 9 and 10 have their ducts interconnected to provide for flow of heating fluid from the inlet duct 13a through all of the ducts of all of the upper heat exchangers and thence out through the outlet duct 14a. Similarly, the ducts of the lower heat exchangers 4a corresponding to the heat exchanger 4 in FIGS. 9 and 10 have their ducts interconnected such that cooling fluid flowing in through duct 7a flows through all of the ducts of all of the lower heat exchangers and thence out through outlet duct 8a. If suitable and desired, the flow paths for the heating and cooling fluids can be other than serial through the heat exchangers. For example, the flow paths could be in parallel or combinations of serial and parallel. The modules in FIG. 12 are suitably electrically interconnected, and the terminals thereof are preferably connected to circuitry of the general type shown in FIG. 10.

While the presently preferred embodiment of the invention has been illustrated and described, various changes, equivalents and alternatives may be resorted to without departing from the spirit of the invention, and all of such changes, equivalents and alternatives are contemplated as may come within the scope of the appended claims and equivalents thereof.

What is claimed as the invention is:

1. A pyroelectric power converter comprising a capacitor formed of dielectric material having temperature dependent capacitance, a regenerative heat transfer medium which exhibits a temperature gradient therealong and with which the capacitor is in continuous heat transfer relation, and actuating means for effecting relative movement of said capacitor and medium along said temperature gradient from a first toward a second relative position, and for alternatively effecting relative return movement of said capacitor and medium along said temperature gradient from said second toward said first position.

2. The converter of claim 1 wherein the heat transfer medium is a solid.

3. The converter of claim 1 wherein the heat transfer medium is a fluid.

4. The converter of claim 1 wherein the heat transfer medium is silicone oil.

5. The converter of claim 1 wherein the medium is a liquid metal.

6. The converter of claim 1 wherein the medium is a liquid metal comprising sodium and potassium.

7. The converter of claim 1 which additionally comprises a heat source in heat transfer relation with said medium, and a heat sink in heat transfer relation with said medium at a point spaced from the point at which said heat source is in heat transfer relation therewith, said capacitor being positioned intermediate said points.

8. The converter of claim 1 wherein the capacitor is fixedly mounted, and the heat transfer medium is moved relative thereto by the actuating means.

9. The converter of claim 1 wherein the capacitor in the first relative position is in thermal contact with one portion of the medium at a predetermined relatively low temperature, and in the second relative position is in thermal contact with another portion of the medium at a predetermined relatively high temperature.

10. The converter of claim 1 wherein the dielectric material of said capacitor exhibits ferroelectric properties within a predetermined temperature range, and the temperatures of the portions of the heat transfer medium with which the capacitor is in heat transfer relation in the first and second relative positions are within said predetermined range.

11. The converter of claim 1 which additionally comprises a source of voltage for electrically charging the capacitor.

12. The converter of claim 1 which additionally comprises a voltage source, an external circuit, switch means for alternately connecting said voltage source and external circuit to said capacitor to permit successive charging of the capacitor from the voltage source and discharging thereof into the external circuit, and an electrical connection between said external circuit and said source for diverting a portion of the discharged electrical energy to said voltage source.

13. The converter of claim 1 wherein the actuating means is adapted to cycle the capacitor and medium between said first and second relative positions, and said converter additionally comprises a source of high voltage, a source of low voltage, and switch means connecting said high and low voltage sources to the capacitor in timed relation with dispostion of the capacitor and medium in said first and second relative positions, respectively.

14. The converter of claim 1 wherein the capacitor forms part of a unitary module comprising a plurality of such capacitors.

15. The converter of claim 1 wherein said capacitor forms part of a unitary module comprising a plurality of such capacitors in heat transfer relation with different temperature portions of the medium, each of said capacitors exhibiting ferroelectric properties within a predetermined temperature range which includes the temperature range of the portions of the heat transfer medium respectively in heat transfer relation therewith.

16. The converter of claim 1 wherein the dielectric material comprises lead zirconate, lead titanate and lead stannate.

17. A pyroelectric power converter comprising a plurality of converters as defined in claim 1 electrically connected in series.

18. A pyroelectric power converter comprising a plurality of converters as defined in claim 1 electrically connected in parallel.

19. A plurality of converters as claimed in claim 1, each of which has a heat source in heat transfer relation with its medium, said heat sources having ducts therethrough for accomodating a heating fluid, the ducts of said heat sources being connected in series to provide a common flow path therethrough for heating fluid; each of said converters also having a heat sink in heat transfer relation with its medium, said heat sinks having ducts therethrough for accomodating a cooling fluid, the ducts of said heat sinks being connected in series to provide a common flow path therethrough for cooling fluid, and a load circuit connected for energization by said converters.

20. A plurality of converters as claimed in claim 1, each of which has a heat source in heat transfer relation with its medium, said heat sources having ducts therethrough for accomodating a heating fluid, the ducts of said heat sources being connected to provide parallel flow paths therethrough for heating fluid; each of said converters also having a heat sink in heat transfer relation with its medium, said heat sinks having ducts therethrough for accomodating a cooling fluid, the ducts of said heat sinks being connected to provide parallel flow paths therethrough for cooling fluid, and a load circuit connected for energization by said converters.

21. The method of pyroelectric power conversion comprising the steps of heating a substantially fully charged capacitor having temperature dependent capacitance from a relatively low temperature to a relatively high temperature; during such heating, partially discharging the capacitor into an external circuit; while at said relatively high temperature, substantially discharging the capacitor into a relatively low voltage source; cooling the capacitor from said relatively high temperature to said relatively low temperature and during such cooling partially recharging the capacitor from a relatively low voltage source; and while at said relatively low temperature, substantially fully recharging the capacitor from a relatively high voltage source, the heating and cooling of the capacitor being effected by successive thermal contact thereof with relatively low and high temperature portions of a heat transfer medium having temperature gradient therein.

22. The method of pyroelectric power conversion which comprises cyclical repetition of the steps of claim 21.

23. The method of claim 21 wherein the relatively high voltage source is incorporated into the external circuit, and said capacitor is alternately connected in circuit with said high and low voltage sources in time relation with heating and cooling of the capacitor.

24. The method of claim 21 wherein successive, thermal contact of the capacitor with the relatively low and high temperature portions of the heat transfer medium is effected by reciprocal relative movement of the capacitor and medium between first and second relative postions.

25. The method of claim 21 wherein said capacitor is held stationary and said heat transfer medium is moved relative thereto to effect the successive thermal contact of the capacitor with the relatively low and high temperature portions of the heat transfer medium.

26. The method of claim 21 wherein the temperature gradient in the heat transfer medium is produced by supplying heat to one portion thereof and removing heat from another portion thereof spaced from said one portion.

27. The method of claim 21 wherein the capacitor forms part of a unitary module comprising a plurality of such capacitors respectively in thermal contact with different temperature portions of the heat transfer medium, said capacitors respectively exhibiting ferroelectric properties within predetermined different temperature ranges which include the temperatures of the respective relatively high and low temperature portions of the heat transfer medium thermally contacted thereby.

28. A pyroelectric power converter comprising a capacitor formed of dielectric material having temperature dependent capacitance; a heat transfer medium which exhibits a temperature gradient therealong and with which the capacitor is in heat transfer relation; actuating means for effecting cycling relative movement of said capacitor and medium along said temperature gradient between first and second relative positions; a source of high voltage; a source of low voltage; and switch means connecting said high and low voltage sources to the capacitor in timed relation with disposition of the capacitor and medium in said first and second relative positions.

29. The method of pyroelectric power conversion comprising the steps of thermally cycling a capacitor having temperature dependent capacitance; charging said capacitor from a relatively low voltage source while the capacitor is being cooled from an elevated temperature; when the capacitor is cooled, charging the capacitor from a high voltage source in an external circuit connected to the capacitor; after the capacitor has been heated, discharging the capacitor into the external circuit; and during such discharge, diverting a portion of the discharged electrical energy to the low voltage source.

30. The method of pyroelectric power conversion comprising the steps of thermally cycling a capacitor having temperature dependent capacitance; charging said capacitor from a relatively low voltage source while the capacitor is being cooled from an elevated temperature; when the capacitor is cooled, charging the capacitor from a high voltage source in an external circuit connected to the capacitor; and after the capacitor has been heated, discharging the capacitor into the external circuit.

31. The converter of claim 1 wherein the actuating means is electroresponsive, and the converter additionally comprises a source of voltage for electrically charging the capacitor, and electrical connection means for powering said actuating means with electrical energy from the capacitor.

32. The converter of claim 1 which additionally comprises a voltage source; an external circuit; and switch means for alternately connecting said voltage source and external circuit to said capacitor to permit successive charging of the capacitor from the voltage source and discharging thereof into the external circuit.

33. A plurality of converters as claimed in claim 1, each of which has a heat source in heat transfer relation with its medium, which heat source has at least one duct therethrough connected to a source of heating fluid; each of said converters also having a heat sink in heat transfer relation with its medium at a point on the medium spaced from the heat source therefor, which heat sink has at least one duct therethrough connected to a source of cooling fluid; and a load circuit connected for energization by said converters.

34. The converter of claim 1 wherein the capacitor in the first relative position is in thermal contact with one portion of the medium and is at a first temperature, and when in the second relative position is in thermal contact with a higher temperature portion of the medium and is at a second temperature about 21° C. higher than said first temperature.

35. The converter of claim 1 wherein the relative movement of the capacitor and medium from said first toward said second relative position causes heating of the capacitor from a relatively low to a relatively high temperature. said dielectric material of said capacitor having a Curie temperature which is about the same as said relatively low temperature.

36. The converter of claim 1 wherein the capacitor forms part of a unitary module comprising a plurality of such capacitors respectively in heat transfer relation with different temperature portions of the medium so that the respective temperatures of said capacitors are different from each other, relative movement of the module and medium from the first toward the second relative position causing heating of each capacitor from a relatively low to a relatively high temperature, the dielectric material of each capacitor having a Curie temperature which is about the same as said relatively low temperature thereof.

37. A pyroelectric power converter comprising a capacitor having temperature dependent capacitance; means for thermally cycling the capacitor between relatively low and relatively high temperatures; electric energy source means providing a low voltage source and high voltage source connected to an external circuit; and switch means connected to said electric energy source means and said capacitor and operable in timed relation with the thermal cycling means for alternately connecting the low voltage source and external circuit to the capacitor to effect partial charging of the capacitor with low voltage while the capacitor is being cooled, charging of the capacitor with high voltage while the capacitor is at said relatively low temperature, and discharge of the capacitor into the external circuit when the capacitor is heated.

38. The pyroelectric power converter of claim 37 which additionally comprises an electrical connection between the external circuit and the low voltage source for diverting a portion of the discharged electrical energy to the low voltage source.

39. The pyroelectric power converter of claim 37 wherein the voltage of the high voltage source is about six times that of the low voltage source.

40. The pyroelectric power converter of claim 37 wherein the voltage of the high voltage source is about 580 volts higher than that of the low voltage source.

41. The pyroelectric power converter of claim 37 wherein the thermal cycling means cycles the capacitor through a temperature range of about 21° C.

42. The converter of claim 37 wherein the capacitor has a Curie temperature which is about the same as said relatively low temperature.

43. A pyroelectric power converter comprising a capacitor formed of dielectric material having temperature dependent capacitance; means for thermally cycling the capacitor between a relatively low and a relatively high temperature; electric energy source means providing a source of low voltage and a source of high voltage connected to an external circuit; and switch means for alternately connecting said high and low voltage sources to the capacitor in timed relation with the operation of said thermal cycling means, the switch means connecting the capacitor to the low voltage source during cooling of the capacitor from the relatively high temperature to thereby cause partial charging of the capacitor from the low voltage source; the switch means switching the connection of the capacitor from the low voltage source to the high voltage source when the capacitor reaches said relatively low temperature to thereby cause charging of the capacitor from the high voltage source, and during subsequent heating of the capacitor, partial discharge thereof into the external circuit; the switch means switching the connection of the capacitor from the high voltage source to the low voltage source when the capacitor reaches the relatively high temperature to thereby cause substantially complete discharge of the capacitor into the low voltage source and completion of one cycle.

44. The pyroelectric power converter of claim 43 which additionally comprises an electrical connection between the external circuit and the low voltage source for diverting to the latter a portion of the electrical energy discharged into the external circuit.

* * * * *